United States Patent [19]

Rinderle

[11] Patent Number: 4,984,031

[45] Date of Patent: Jan. 8, 1991

[54] INTEGRATED CIRCUIT ARRANGEMENT

[75] Inventor: Heinz Rinderle, Heilbronn, Fed. Rep. of Germany

[73] Assignee: Telefunken Electronic GmbH, Heilbronn, Fed. Rep. of Germany

[21] Appl. No.: 188,554

[22] Filed: Apr. 29, 1988

[30] Foreign Application Priority Data

May 2, 1987 [DE] Fed. Rep. of Germany ....... 3714647

[51] Int. Cl.$^5$ .............................................. H01L 29/90
[52] U.S. Cl. .......................................... 357/13; 357/51
[58] Field of Search .................................... 357/13, 51

[56] References Cited

U.S. PATENT DOCUMENTS

| | | | |
|---|---|---|---|
| 3,562,547 | 2/1971 | Brode et al. | 307/202 |
| 3,590,340 | 6/1971 | Kubo et al. | 357/51 |
| 3,619,725 | 11/1971 | Soden et al. | 357/51 |
| 4,135,295 | 1/1979 | Price | 357/51 |
| 4,491,860 | 1/1985 | Lim | 357/51 |
| 4,507,756 | 3/1985 | McElroy | 357/51 |
| 4,667,216 | 5/1987 | Bigall et al. | 357/51 |

FOREIGN PATENT DOCUMENTS

| | | | |
|---|---|---|---|
| 0112034 | 6/1984 | European Pat. Off. | 357/51 |
| 0211622 | 2/1987 | European Pat. Off. | |
| 0215493 | 3/1987 | European Pat. Off. | |
| 0128656 | 6/1988 | Japan | 357/51 |
| 0148671 | 6/1988 | Japan | 357/51 |
| 2133926 | 8/1984 | United Kingdom | |

OTHER PUBLICATIONS

T. H. Baker, L. E. Freed, C. L. Kaufman & D. Tuman, "Three-Layered Underpass Resistor Structure", vol. 14, No. 10, Mar. 1972, p. 2902.

R. Levi, "Reactive Ion Etch Technique for Reducing Series Resistance in Large-Scale Integrated Devices", vol. 20, No. 8, Jan. 1978, pp. 3127 & 3128.

Primary Examiner—William L. Sikes
Assistant Examiner—Robert E. Wise
Attorney, Agent, or Firm—Spencer & Frank

[57] ABSTRACT

In an integrated circuit arrangement with a protective arrangement at least partially integrated into it and protecting the integrated circuit arrangement from high-energy electrical faults, the protective arrangement has an ohmic resistance in the form of one or more resistance areas that is designed so as to absorb a major proportion of the energy from electrical faults in the event of limit loads and distribute the heat generated within it by the energy absorption over a surface of the protective arrangement such that the protective arrangement affected by the heat energy of the ohmic resistance is not thermally overloaded. Furthermore, the protective arrangement has a voltage-limiting element or several voltage-limiting elements to limit the interference voltage.

27 Claims, 14 Drawing Sheets

INTEGRATED CIRCUIT ARRANGEMENT

BACKGROUND OF THE INVENTION

The invention relates to a circuit arrangement with a protective arrangement at least partially integrated into it and protecting the integrated circuit arrangement from high-energy electrical faults acting upon it.

High-energy electrical faults are, for example, faults resulting from electrostatic discharges and that can affect the connections of integrated circuits when the latter are handled and so cause irreversible changes in the integrated circuit and even render it useless. Electrostatic discharges of this nature occur in a variety of types and intensities and are therefore difficult to describe in detail. However, in order to gauge the sensitivity of integrated circuits to such faults with a finite probability, integrated circuits too —and electronic components in general —are increasingly being subjected to stress tests that simulate electrostatic discharge processes by means of certain test arrays. In these tests, the connections of the integrated circuit are subjected to a certain pulse-type load in accordance with a specified pattern.

In principle, a capacitor of given capacitance is charged to a specified voltage in stress tests, and discharged under certain conditions via the component being tested. In practice, two versions of test circuits are preferred, and are described in greater detail in the following. The first version of a test circuit is shown in FIG. 1. In the test circuit according to FIG. 1, the capacitor C is charged from a voltage source Q via the resistor R1 and discharged via resistor R2 and the test object by operating the switch S. The resistor R2 is here only intended to protect the voltage source Q and to avoid dangerous ground faults in case of contact.

The second version of a test circuit is shown in FIG. 4. The test circuit in FIG. 4 differs from the circuit shown in FIG. 1 in that the resistance R2 of the first version has been dispensed with. The omission of resistor R2 in the second version has the effect that the full electrical energy of the charged capacitor C acts on the test object in the second test circuit version (FIG. 4). The first version of the test circuit is used mainly for testing MOS circuits, while the second version is increasingly being used for testing bipolar integrated circuits. The appropriate test specifications state that the tests must be conducted with both polarities.

The stress tests carried out on integrated circuits have shown that the appearance of damaged circuit elements largely corresponds to that obtained in practice, so that the described testing methods can be applied more and more for the assessment of integrated circuits. Moreover, test methods of this type will be used for evaluation of the protective arrangement in the development of these protective arrangements for integrated circuits.

In order to obtain a clear picture of the processes that take place during testing using the known test circuits (version 1 or version 2), the discharge processes taking place were simulated, as these processes are not measurable in practice because of their non-periodical and rapid nature. For this purpose, the test circuit first had to be converted to an equivalent circuit suitable for simulation. FIG. 2 shows the equivalent circuit used for simulation of the test circuit according to FIG. 1 (version 1). In the simulation, the test object was first replaced by an ohmic load resistor $R_L$. The load resistor $R_L$ was first set at 1 Ohm. In the equivalent circuit according to FIG. 2, the changeover process of the switch S is simulated by a voltage jump of the generator Q. The important circuit elements of the discharge circuit are, according to FIG. 2, represented by the elements C, L1, R3, C1, L2, R4, C2, R5, C3, R6 and $R_L$.

The self-inductance L1 of the equivalent circuit according to FIG. 2 characterizes the connected self-inductance of the capacitor C of FIG. 1. The resistor R3 characterizes the transition resistances of switch S, and capacitor C1 represents the capacitance of switch S in the switch setting K1 and the power cable capacitances to resistor R2. Resistor R2 is simulated by the elements L2, R4, R5, C3 and R6. The load is simulated by the resistor $R_L$.

FIG. 3 shows the result of the simulation based on the equivalent circuit according to FIG. 2. In the simulation the voltage generator Q was switched from zero to 2000 V (positive). FIG. 3 shows the current curve as a function of time when an ohmic resistance $R_L = 1$ Ohm is used for load simulation. The current shown in FIG. 3 is the current flowing through the load resistor.

FIG. 5 shows the equivalent circuit for the test circuit according to FIG. 4. The inductance L3 characterizes the self-inductance of the discharge circuit of FIG. 4, while the resistor R7 characterizes the self-damping of the discharge circuit of FIG. 4. The load is simulated by $R_L$.

FIG. 6 shows the result of the simulation with the aid of the equivalent circuit according to FIG. 5, for a voltage jump in the generator Q at zero time from zero to 500 V. $R_L$ has the value of 1 Ohm here also. As in FIG. 3, the simulated time range + (abscissa) extends from 0 to 100 nsecs.

If FIGS. 3 and 6 are compared, it can be seen that when the second test circuit (FIG. 4) is used, considerably higher currents are encountered than with the use of the first test circuit (FIG. 1). This result applies for both polarities of the generator voltage. It must be taken into account here that the voltage of the generator Q that was used in the second test method is substantially lower than the voltage used in the first test method, i.e. 500 V compared with 2000 V in the first test method.

From this comparison it is clear that the second test method is (or appears to be) substantially more critical for the integrated circuit being tested than the first test method.

In addition to the current/time curve, the output/time curve is also of interest. FIG. 7 shows the output/time curve for load resistor $R_L$ when $R_L = 1$ Ohm. The output/time curve of FIG. 7 is also obtained by simulation, in particular by forming the product of voltage and current at resistor $R_L$. The current/time curve was determined using the equivalent circuit according to FIG. 4. This also applies for FIGS. 8 and 9, of which FIG. 8 shows the current/time curve for a load resistor $R_L = 11$ Ohm and FIG. 9 the output/time curve also for a load resistor $R_L = 11$ Ohm. Accordingly, a higher value for $R_L$ implies the occurrence of a substantially higher peak output value with more rapid decrease at the same time. The illustrations show that the short-term load is substantially greater the higher the load resistance in the value range illustrated.

Tests have shown that integrated circuits subjected to the tests described frequently have local "melt channels" in the area of the circuit components under load, these being due to severe local overheating. Occurrences of this nature can be frequently found in the semiconductor zones with weak doping. It is therefore probable that the "melt channels" result from a temperature-induced intrinsic conduction (an increase in resistance with a rise in temperature) of the semiconductor material, said conduction exceeding the extrinsic conduction as the material exceeds certain temperatures. Since the intrinsic conduction (inversion density) rises exponentially with the temperature, the current concentrates cumulatively in a "kindled" semiconductor area of this type and so heats up the semiconductor material locally. This process is not generally controllable; this is understandable when, as the theory on the temperature dependence of intrinsic conduction (inversion density) for silicon states, the intrinsic conduction is decisive for the electrical resistance in a silicon zone with an impurity concentration of, for example, $10^{15}$ cm$^{-3}$ at a temperature of only approx. 280° C., i.e. the conductivity rises exponentially from a crystal temperature of this value. By way of comparison this is only the case above approx. 1400° C. with an impurity concentration of $10^{19}$ cm$^{-3}$, i.e. at temperatures close to the melting point of silicon.

SUMMARY OF THE INVENTION

The object underlying the invention is therefore to provide a protective arrangement for an integrated circuit arrangement that protects itself from the aforementioned unwelcome faults acting on the integrated circuit and either strongly reduces the effect of the fault on the connected integrated circuit arrangement to be protected or ensures its protection. According to the invention, the protective arrangement has an ohmic resistor in the form of one or more resistance areas or zones and designed such that it absorbs a substantial proportion of the energy of the electrical fault in the event of a limit load and that it distributes the heat generated in it from the energy absorption over a surface of the protective arrangement such that the protective arrangement affected by the heat energy of the ohmic resistance is not thermally overloaded. The protective arrangement has a voltage-limiting element or several voltage-limiting elements to limit the interference voltage.

The voltage-limiting element(s) is (are) designed preferably in such a way that the discharge energy supplied to it (them) does not overload the voltage-limiting element(s).

The ohmic resistance areas can be designed, for example, as resistance zones in the semiconductor element and/or as a metal conduction path on the surface of the intergrated circuit arrangement. In the case of the resistance being provided in the semiconductor element it is advantageous to form the resistance zones from semiconductor zones having a higher impurity concentration (e.g. greater than $10^{19}$ cm$^{-3}$). This eliminates the effect of uncontrollable intrinsic conduction which can lead to an unstable current distribution within the semiconductor. A resistor in the semiconductor area is preferably arranged at a distance from the semiconductor surface corresponding to a buried layer. Resistance zones in the semiconductor element can also be arranged in the surface area, for example with an n+ zone formed by a commutator connection diffusion in a high-resistance, weakly doped n-area (epitaxy layer). A further possibility of forming an insulated resistor with strongly doped semiconductor layer is, for example, to use a p+ diffusion, which is deposited in a buried layer zone through an n-epitaxy layer.

Another aspect for designing the resistance zone in accordance with the invention is the avoidance of a field strength breakdown in the resistance zone, since a field strength breakdown can neutralize or partially neutralize the resistance zone. This can come about, for example, by the breakdown zone completely or partially bridging the resistance zone. The resistance zone must therefore be so designed that the breakdown field strength ($2 \ldots 10 \times 10^5$ V/cm) cannot occur at any point of the resistance zone under the maximum stress load.

In accordance with an embodiment of the invention it is provided that the discharge energy is partially converted to heat energy in the substrate of the semiconductor element (substrate for protective arrangement and integrated circuit arrangement) by channelling the discharge process via the substrate area serving as a resistance zone. This has the advantage that the other parts of the protective arrangement can be with a smaller crystal surface requirement, since their electrical load is lower. A further advantage of using the substrate resistance is that the voltage drop in the substrate area does not have the effect of a voltage load for the zone between the connection pad and the substrate area beneath it when said substrate area is connected to the substrate area of the protective arrangement. In the case of the substrate resistance being used it must however be noted that as a result of the voltage drop in the crucial substrate resistance, the output potential of the protective arrangement is lowered or raised — depending on the polarity of the fault — by the amount of voltage drop at the substrate resistor when a fault occurs.

To avoid negative effects from the voltage drop on the circuit to be protected, it is recommended that the ground based reference point of the circuit to be protected be allocated directly to the substrate area with which the voltage-limiting element of the protective arrangement is connected. This ensures that in the event of a fault the circuit to be protected is only supplied with peak voltages that correspond to the levels of the voltages occurring at the voltage-limiting elements of the protective arrangement.

It is further advantageous to "disconnect" the substrate area of the protective arrangement from the other substrate areas of the integrated circuit and to connect the substrate area of the protective arrangement to the reference point (earth) of the integrated circuit via a separate conduction path, with the required substrate resistance of the protective arrangement being achieved by appropriate design of the separation connecting zone. A "disconnection" of the substrate area of the protective arrangement from the substrate areas of the remaining integrated circuit has the advantage that this achieves a greater protective effect for other integrated circuit components beyond the immediately protected circuit component in the event of a fault.

A "disconnection" of the substrate area of the protective arrangement from the substrate areas of the other circuit components can for instance be achieved by providing, around the substrate area of the allocated connecting pad of the integrated circuit, a zone with relatively low conductivity that separates the low-resistance substrate area of the protective arrangement from the other low-resistance substrate areas of the integrated circuit. The low-resistance substrate areas are generally formed by a separation diffusion of the p-conduction type, while the zone with the relatively low conductivity is determined by the weakly-doped area of the p-conduction type of the substrate material of the semiconductor element.

BRIEF DESCRIPTION OF THE DRAWINGS

The invention will now be described in greater detail, by way of examples, with reference to the drawings, in which.

DESCRIPTION OF THE PREFERRED EMBODIMENTS

FIGS. 10 to 14 show the manufacture of a protective arrangement according to the invention intended to protect an integrated circuit arrangement which is in the same semiconductor element as the protective arrangement, but which is not illustrated in the following figures. In accordance with FIG. 10, a semiconductor element 1 (also semiconductor element of the integrated circuit arrangement not illustrated) is assumed when manufacturing the protective arrangement, said element having the p-conduction type in the embodiment. In the semiconductor element 1 a resistance zone 2 is provided in accordance with FIG. 10, the conduction type of which is opposite that of the semiconductor element 1 and accordingly is of the n-conduction type in FIG. 10. The resistance zone 2 is relatively strongly doped and has, for example, an impurity concentration of $10^{19}$ cm$^{-3}$.

Figure 11:
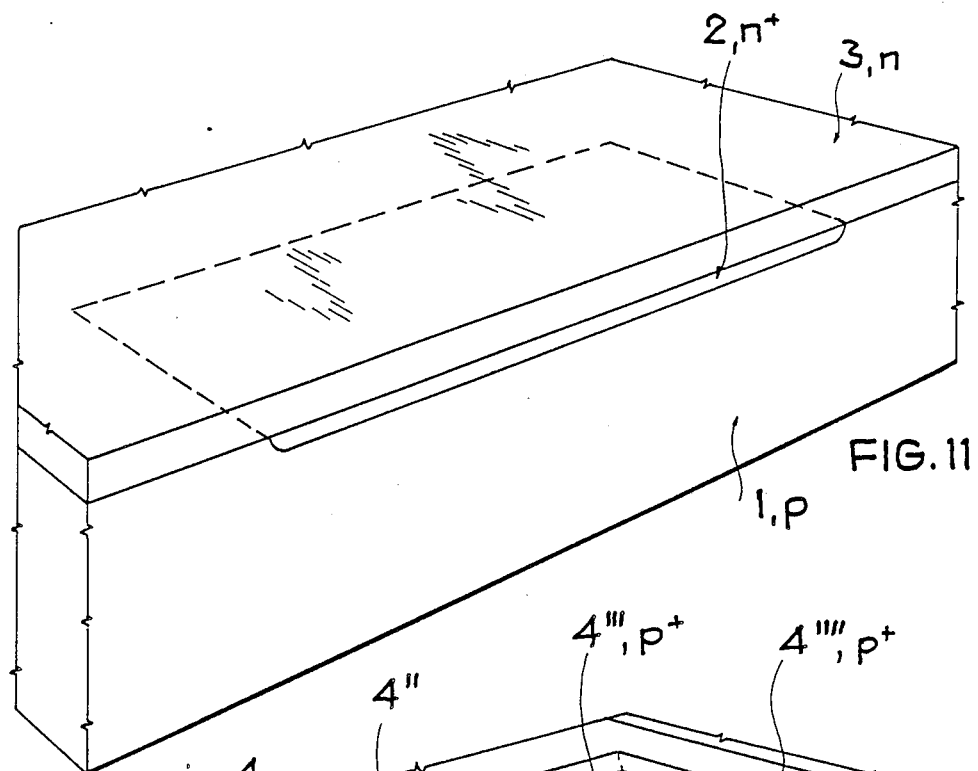
Figure 12:
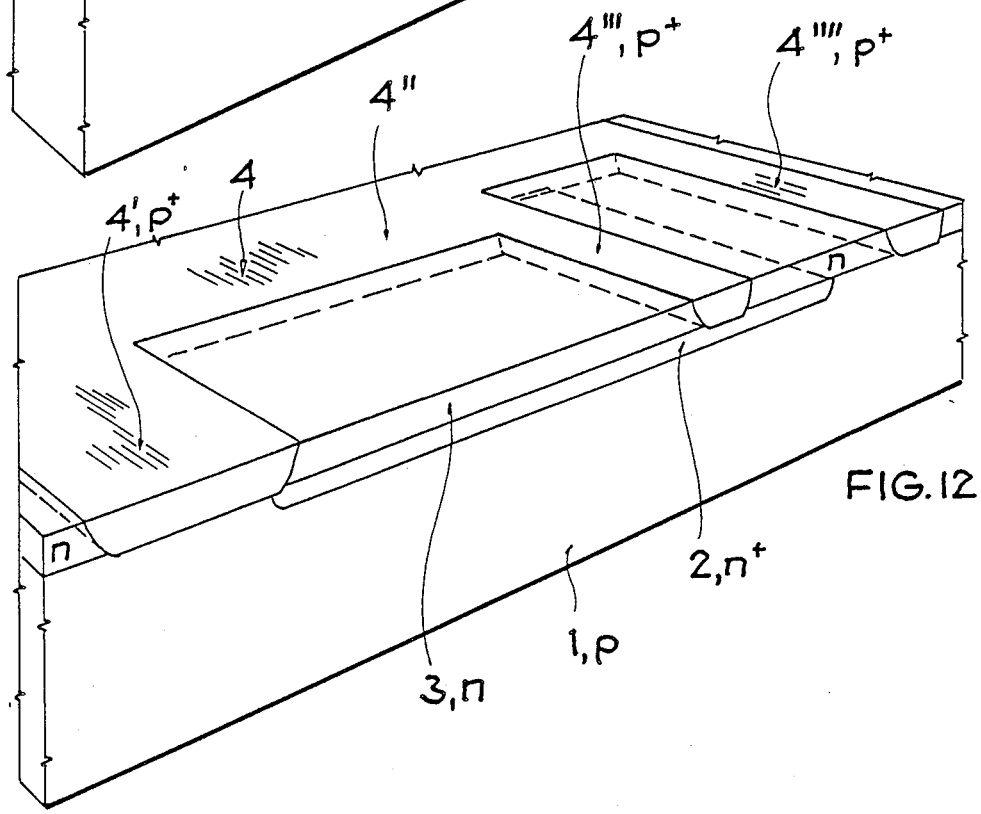

According to FIG. 11, an epitaxy layer 3 of n-conduction type is deposited on the semiconductor element 1 (substrate) of p-conduction type with the resistance zone 2 of n-conduction type, such that the resistance zone 2 between the substrate 1 and the epitaxy layer 3 is buried (buried layer). In accordance with FIG. 12, a semiconductor zone 4 of p-conduction type is formed in the epitaxy layer 3, the regions 4', 4" and 4''' of said zone together with the adjoining resistance zone 2 forming a zener diode which is used as a voltage-limiting element. The p-regions 4' and 4" also fulfill, together with the p-regions 4''', the function of a separation zone. The p-region 4''' is in contact with the resistance zone 2 over the whole underside, while the p-regions 4' is only in contact with the resistance zone at the edge. The p-areas 4', 4", 4''' and 4'''' are deposited so deeply that they touch the resistance zone 2 or substrate 1. The p-zone 4 is formed in a single operation in the semiconductor element comprising substrate 1 and epitaxy layer 3, for example by diffusion or by ion implantation.

Figure 13:
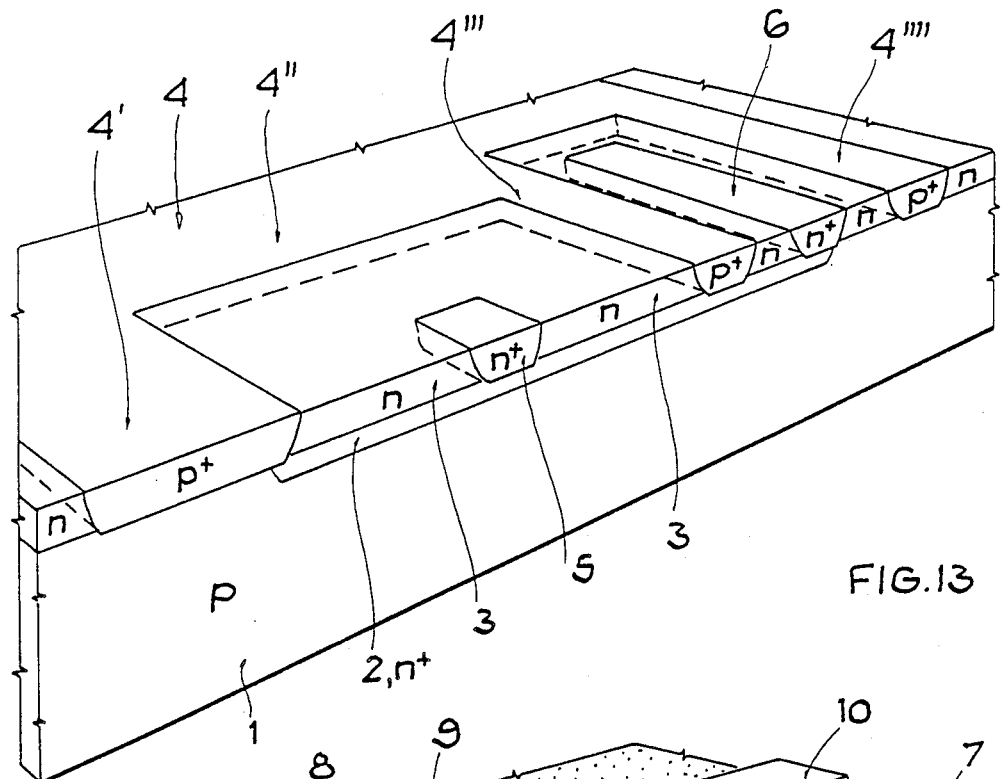

The resistance area 2 is connected in accordance with FIG. 13 using the connection zones 5 and 6 of the n-conduction type, which are made after the p-zones, likewise by diffusion or ion implantation, for example. The connection zone 5 in FIG. 13 is the input connection for the resistance zone 2 and is in the centre of the resistance zone 2.

Figure 14:
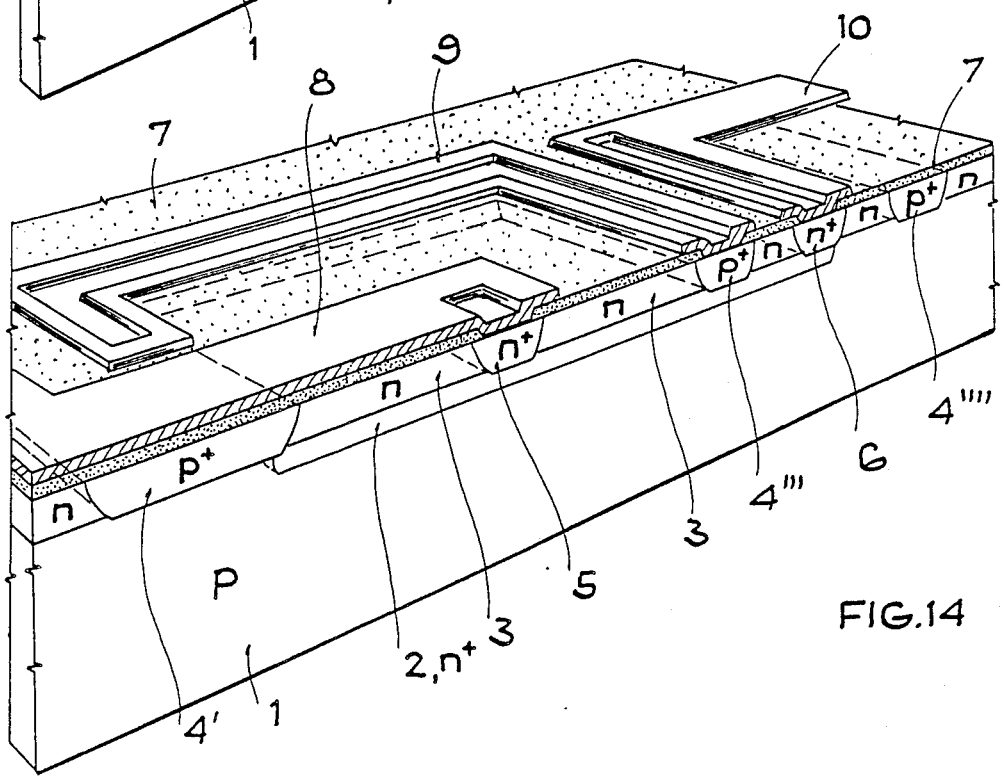

FIG. 14 shows the finished protective arrangement with an insulating layer 7 on the surface of the epitaxy layer 3 and the zone formed therein and with a conduction path 8 leading to the connection zone 5, with a conduction path 9 connecting the p-regions 4', 4" and 4''', and with a conduction path 10 providing the electrical connection between the connection zone 6 and the subsequent integrated circuit arrangement, not illustrated, in the same semiconductor element.

Figure 15:
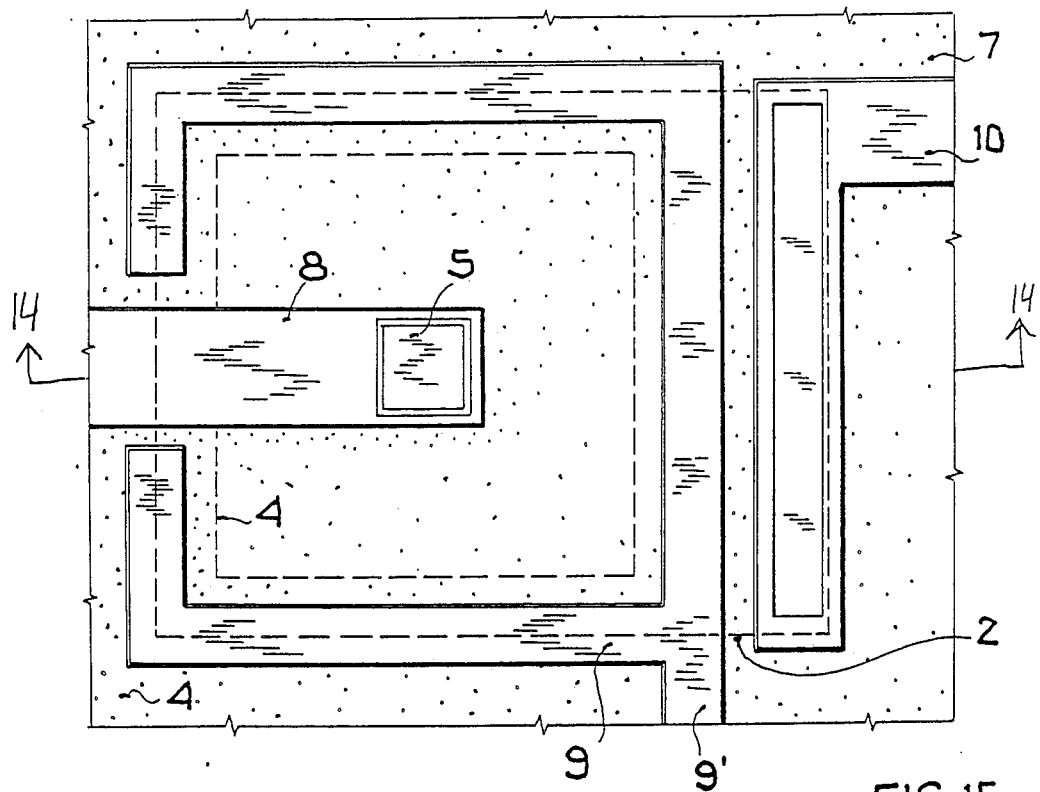
FIG. 15 is a top plan view of the protective arrangement in FIG. 14.

FIG. 15 is the plan view of the protective arrangement according to FIG. 14.

FIG. 15 indicates a conduction path 9', connecting the reference point of the subsequent integrated circuit to be protected (not illustrated) and the reference point (p-regions 4, 4', 4", 4''') of the voltage-limiting zener diode of the arrangement according to the invention as shown in FIG. 13.

Figure 16:
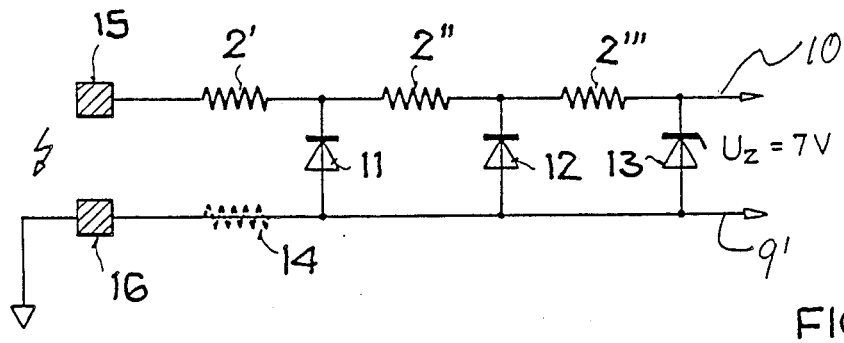
FIG. 16 is a schematic diagram of the equivalent circuit of the protective arrangement according to FIGS. 14 and 15.

FIG. 16 shows the equivalent circuit diagram of the protective arrangement according to FIGS. 14 and 15. In the equivalent circuit diagram in FIG. 16 the resistance zone 2 is subdivided into the resistance regions 2', 2" and 2''', since in the embodiment of the invention according to FIGS. 14 and 15 a large-area diode is effective between the resistance zone 2 and the substrate 1, said diode being formed by the p-n junction between the resistance zone 2 and the substrate 1. This diode is shown in simplified form by the diodes 11 and 12 in the equivalent circuit according to FIG. 16. The zener diode is numbered 13. The resistance 14 shown in broken lines represents the substrate resistance. The connection points of the circuit are numbered 15 and 16.

With the aid of the equivalent circuit according to FIG. 16 the operation of the protective arrangement can be explained. If one of the faults described occurs at the connection terminals 15 and 16, the current will flow via the resistors 2', 2" and 2''', the zener diode 13 as a voltage-limiting element, and the substrate resistance 14 when the interference voltage between 15 and 16 is of positive polarity. Diodes 11 and 12 are then blocked. If the interference voltage between 15 and 16 has negative polarity, diodes 11 and 12 become conductive, i.e. the current caused by the fault flows off via the resistance zones 2', 2" and 2''' to the substrate and via the diodes 11, 12 and 13 which are then effective in the flow direction. In accordance with the invention, the resistance zones 2', 2", 2''' and 14 are so dimensioned and designed that they absorb the major part of the energy from the expected peak load up to which the protective arrangement is to function, and distribute the heat thereby generated over a greater crystal volume. In order to prevent the voltage drop at the substrate resistor 14 caused by the current flow from affecting the subsequent integrated circuit to be protected, provision is preferably made for selecting the connection point of the anode of the zener diode 13 and the substrate region of the zener diode 13 as the reference point for the subsequent circuit.

Figure 17:
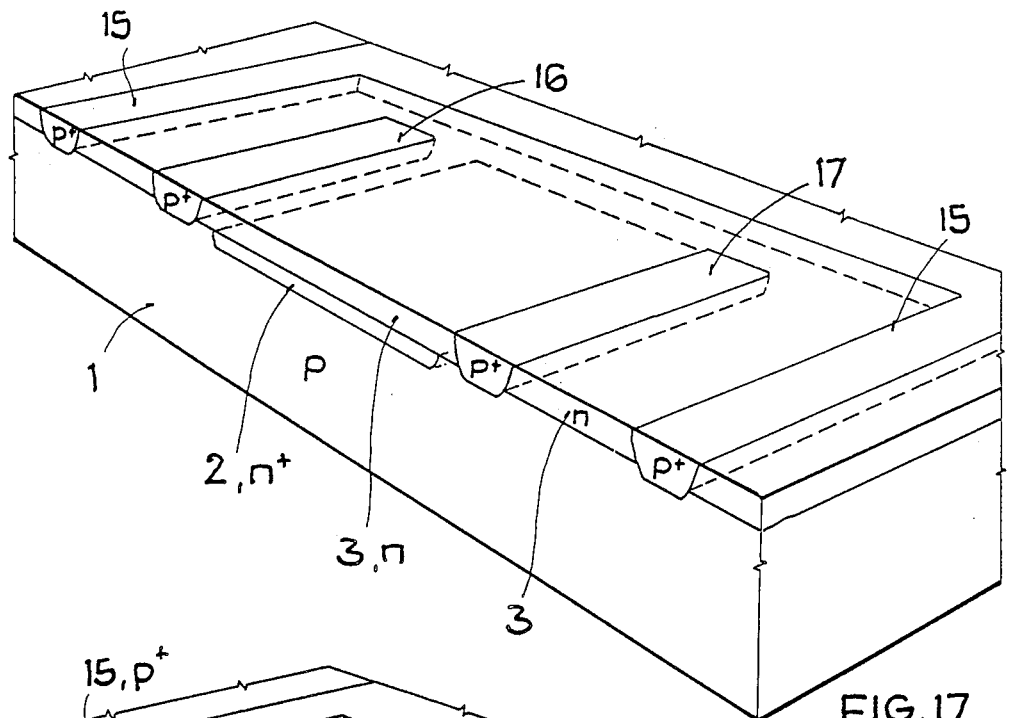
FIGS. 17-19 are perspective views of the various consecutive steps in the manufacture of a protective arrangement according to an alternative embodiment the invention.

In the following, the manufacture of another embodiment of a protective arrangement according to the invention is described. In accordance with FIG. 17, the semiconductor p-zones 15, 16 and 17 of p-conduction type are deposited such that they are in contact with substrate 1, in order to manufacture this protective arrangement in a semiconductor element comprising a substrate 1 of p-conduction type, a buried layer 2 (resistance area) of n-conduction type and an epitaxy layer 3 of n-conduction type. The p-zones 15, 16 and 17 are made by diffusion or by ion implantation, for example. The p-zone 15 acts as the separation zone while p-zones 16 and 17 are the semiconductor zones of zener diodes.

Figure 18:
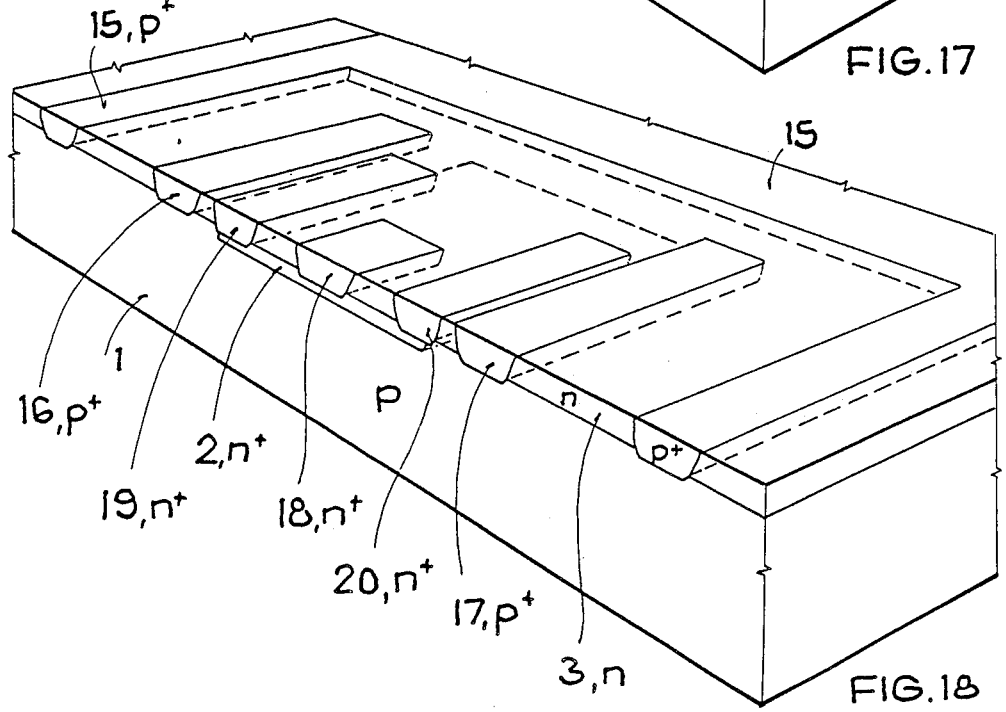
Figure 19:
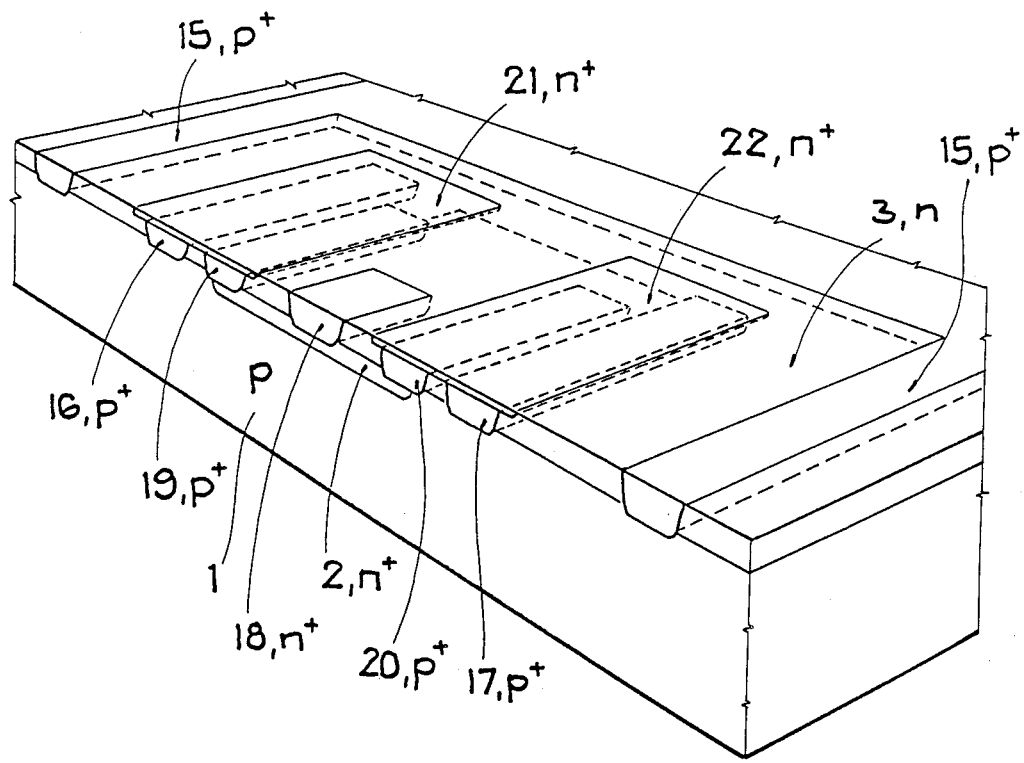

After the manufacture of the p-zones 15, 16 and 17, the semiconductor connection zones 18, 19 and 20 for the resistance zone 2 are manufactured in accordance with FIG. 18. The connection zones 18, 19 and 20 are of the n-conduction type. In accordance with FIG. 19, the n-zones 21 and 22 are then manufactured, their depth being less than that of the semiconductor zones previously manufactured in the epitaxy layer 3. The semiconductor zone 21 extends from the semiconductor zone 19 to the semiconductor zone 16 and covers these two semiconductor zones. Semiconductor zone 22 extends from semiconductor zone 17 to semiconductor zone 20 and covers these two semiconductor zones. FIG. 19 has two zener diodes, one of which is formed by the semiconductor zone 21 and p-zone 16 while the other zener diode is formed by the semiconductor zones 22 and p-zone 17.

The overlap of the semiconductor zone 16 (p$^+$-zone) by the semiconductor zone 21 (n$^+$-zone), and of semiconductor zone 17 by semiconductor zone 22, has the effect that the junction layers of these zones do not touch the surface of the semiconductor element at any point, so that the p-n junction is protected from surface effects.

Figure 20:
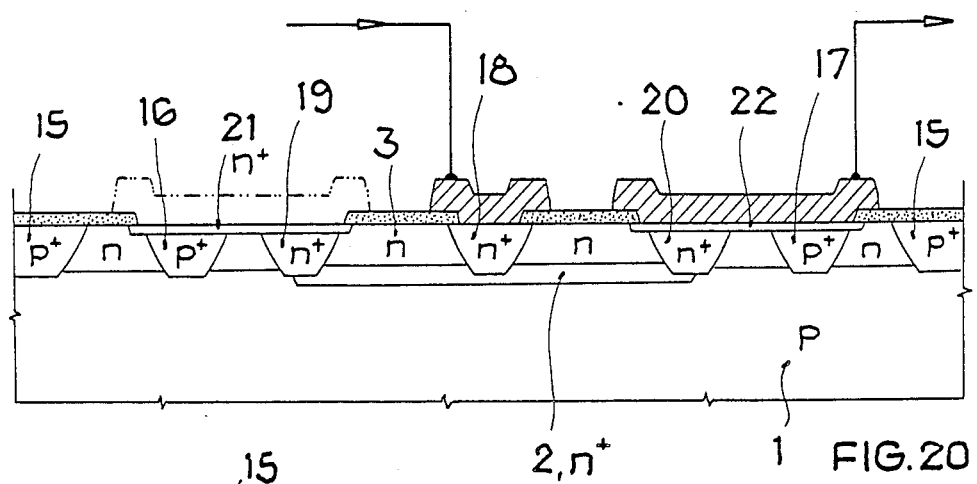
FIG. 20 is a side cross-sectional view of the finished protective arrangement of figure.
Figure 21:
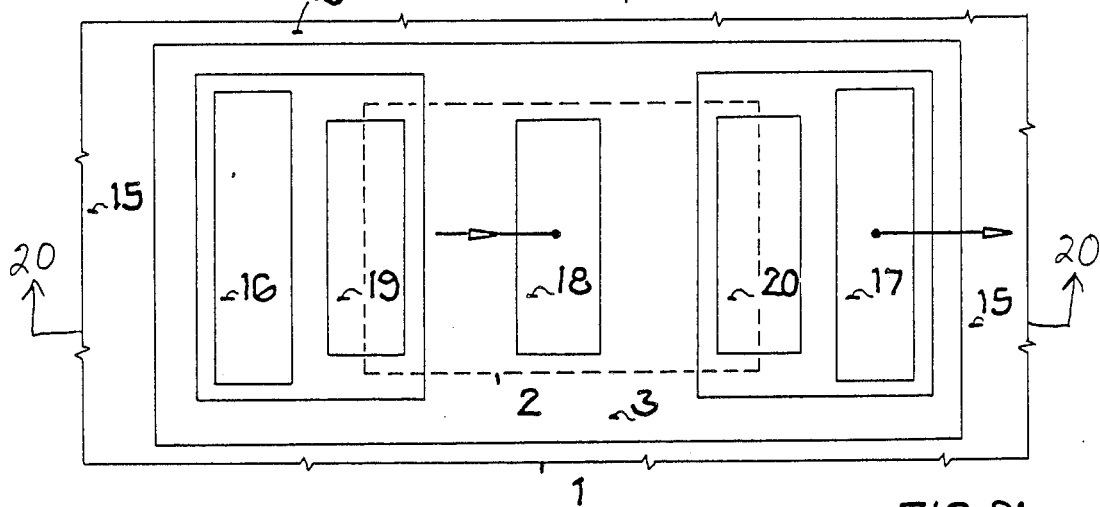
FIG. 21 is a top plan view of the finished protective arrangement of figure.

The finished protective arrangement is shown in FIGS. 20 and 21, with FIG. 20 being a sectional view and FIG. 21 a plan view.

Figure 22:
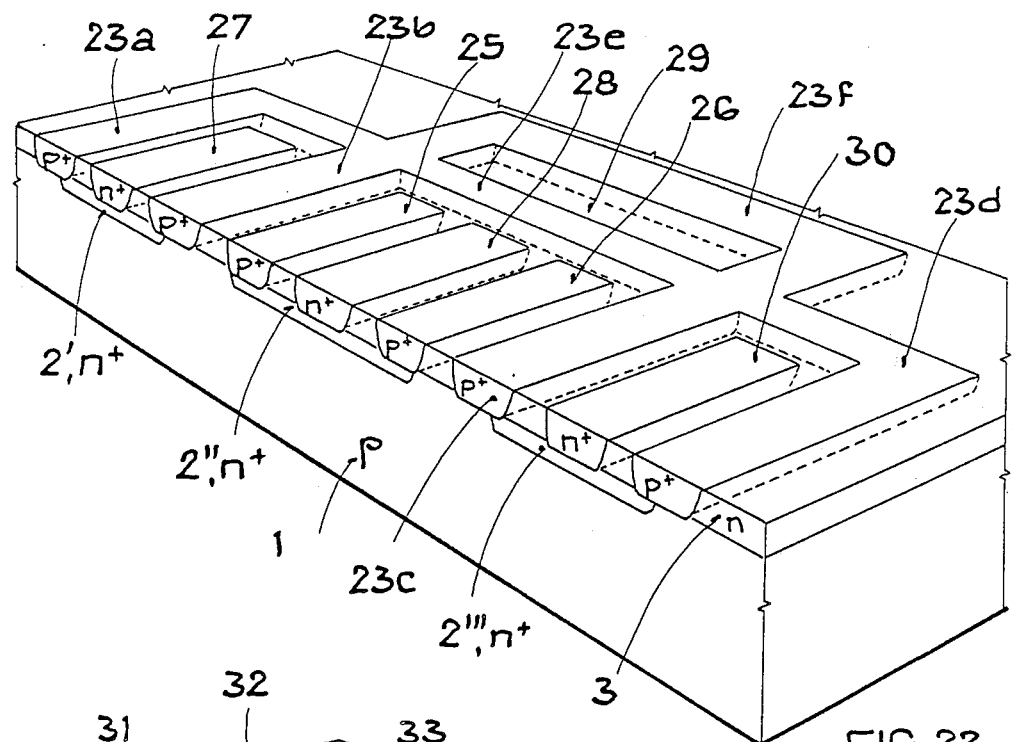
FIG. 22 is a perspective view of a protective arrangement in which pairs of zener diodes are connected in series.
Figure 23:
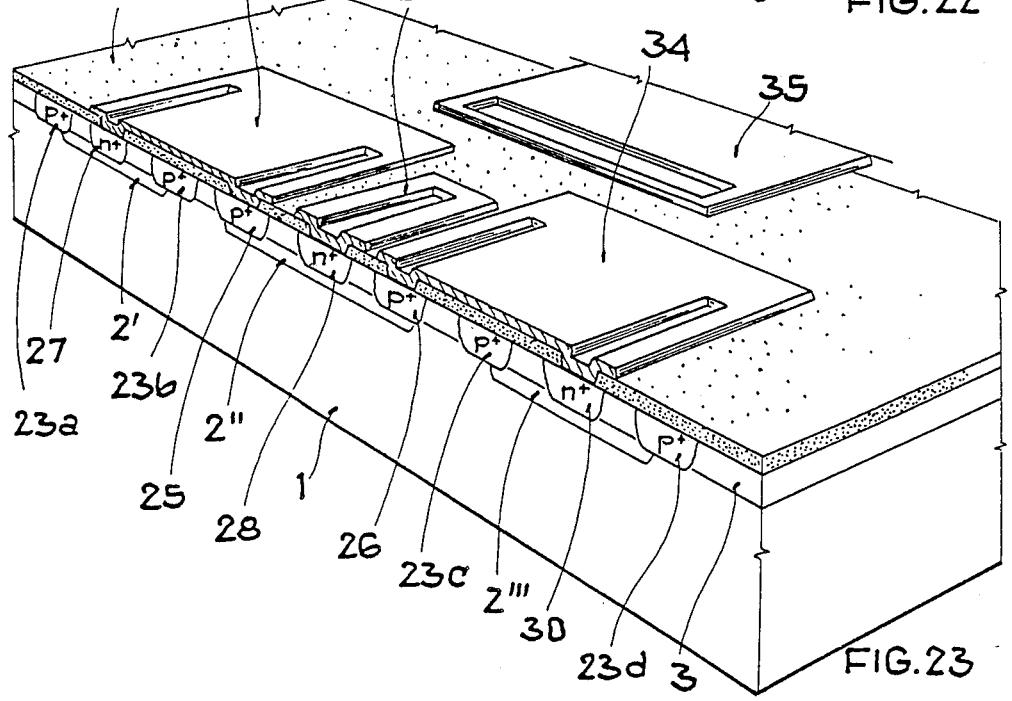
FIG. 23 is a perspective view of the finished protective arrangement evolved from FIG. 22.
Figure 24:
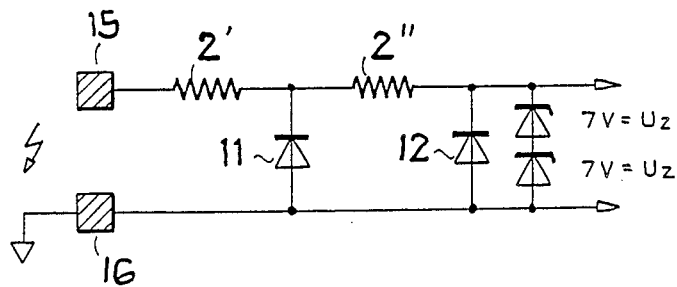
FIG. 24 is a schematic diagram of the equivalent circuit of the arrangement according to FIG. 23.

While FIGS. 19, 20 and 21 show a protective arrangement in which two zener diodes are effectively parallel to one another, FIGS. 22 and 23 show a protective arrangement in which pairs of diodes are connected in series, with these series connections being effectively parallel to one another. According to FIG. 22, the semiconductor element of this protective arrangement again comprises a substrate 1 of p-conduction type and an epitaxy layer 3 of n-conduction type. In the protective arrangement according to FIG. 22, three resistance regions 2', 2", and 2''' are provided in the form of buried layers. A separation zone 23 of p-conduction type is deposited in the epitaxy layer 3 according to FIG. 22, said zone comprising the regions 23a, 23b, 23c, 23d, 23e and 23f. The separation regions 23a forms together with the resistance regions 2' a zener diode, separation region 23b together with resistance region 2' a zener diode, separation region 23c together with resistance region 2''' a zener diode, and separation region 23d together with resistance region 2''' a zener diode. The connection zone 27 of n-conduction type forms a connection for the resistance region 2', connection zones 28 and 29 form connections for the resistance region 2", and connection zone 30 of the n-conduction type forms a connection for the resistance region 2'''. FIG. 23 shows the finished protective arrangement with the insulating layer 31 on the epitaxy layer 3 and with the electrodes 32, 33, 34 and 35. FIG. 24 shows the appropriate equivalent circuit diagram.

A protective arrangement according to FIGS. 22, 23 and 24 has the advantage over the protective arrangement according to FIGS. 14, 20 and 21 that the series-connected zener diodes as voltage-limiting elements permit the selection of a correspondingly higher operating voltage for the subsequent circuit to be protected.

Figure 25:
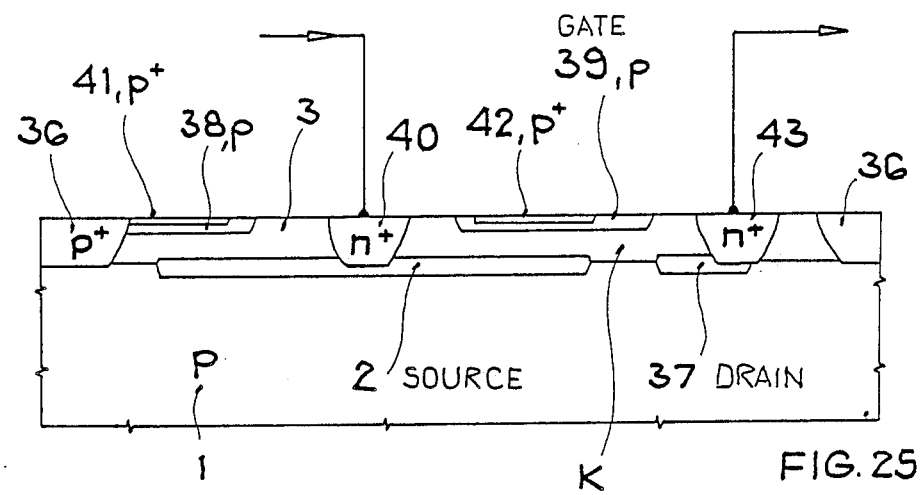
FIG. 25 is a side cross-sectional view of a further protective arrangement in accordance with the invention.

FIG. 25 shows a further protective arrangement in accordance with the invention, again having a substrate 1 of p-conduction type and an epitaxy layer 3 of n-conduction type. The protective arrangement of FIG. 25 is surrounded by a separation zone 36 of the p-conduction type. Between the epitaxy layer 3 and the substrate 1 is a resistance zone 2 which doubles as the source zone of a field-effect transistor. The drain zone of this field-effect transistor is formed by a semiconductor zone 37 of the n-conduction type. In the epitaxy layer 3 are the two p-zones 38 and 39, which together with the epitaxy layer 3 of the n-conduction type form zener diodes. In addition, the p-zone 39 forms the gate electrode of a field-effect transistor. The resistance zone 2 or the source zone is in contact with the connection zone 40, while the p-zone 38 is in contact with the connection zone 41 and the p-zone 39 with the connection zone 42. The drain zone 37 is in contact with the connection zone 43. The connection zones 41 and 42 are connected to the insulation zone 36.

Figure 26:
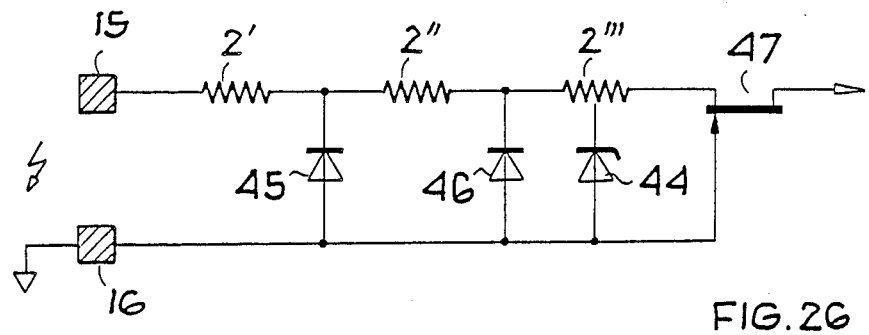
FIG. 26 is a schematic diagram of the equivalent circuit diagram of the arrangement according to FIG. 25.

FIG. 26 shows the equivalent circuit diagram of the protective arrangement of FIG. 25 with the zener diode 44, the two substrate diodes 45 and 46 characterizing the p-n junction of the resistance zones 2 to the substrate 1, the resistance regions 2', 2" and 2"', and the field-effect transistor 47.

The field-effect transistor in the protective arrangement according to FIGS. 25 and 26 has the task of limiting the current occurring at the output of the protective arrangement in the event of a fault, thus expanding the protective function. This is achieved by the channel area K (FIG. 25) of the integrated field-effect transistor being cut off when a higher (positive) interference voltage occurs at the source electrode. The use of a field-effect transistor at the output of a protective arrangement according to the invention is also suitable for versions of protective arrangements already described.

The resistor of the protective arrangement according to the invention, which has to absorb the major part of the energy from a limit load and which, for example, is characterized by the sum of the partial resistors 2', 2" and 2"' in FIG. 16, is preferably dimensioned so that the sum of the voltage drop at this resistor and of the value of the zener voltage does not reach, in the event of a limit load (maximum "interference current" expected), the value of the breakdown voltage for the distance between the connection pad 15 and the area underneath it, e.g. oxide layer including n-box.

Figure 1:
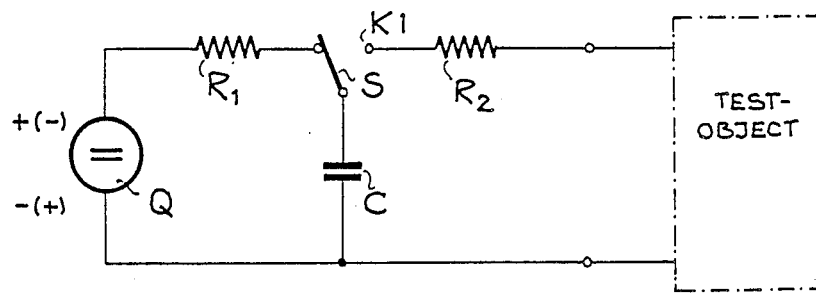
FIG. 1 is a schematic diagram of a prior art apparatus for testing integrated circuits.
Figure 2:
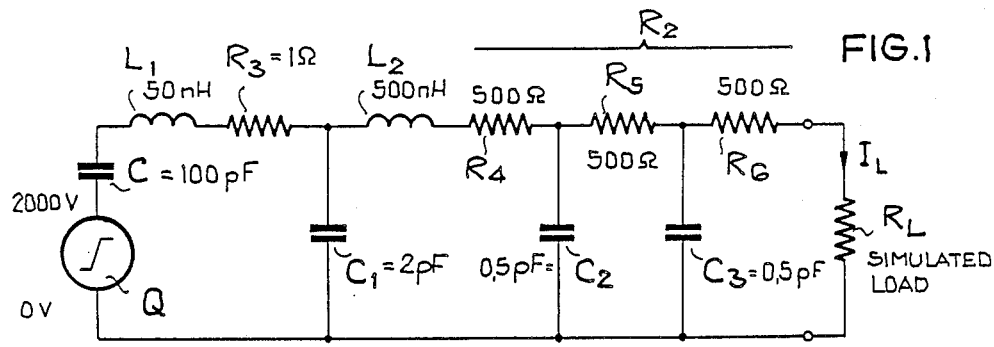
FIG. 2 is a schematic diagram of a prior art simulation circuit for simulating the response of the apparatus of FIG. 1.
Figure 3:
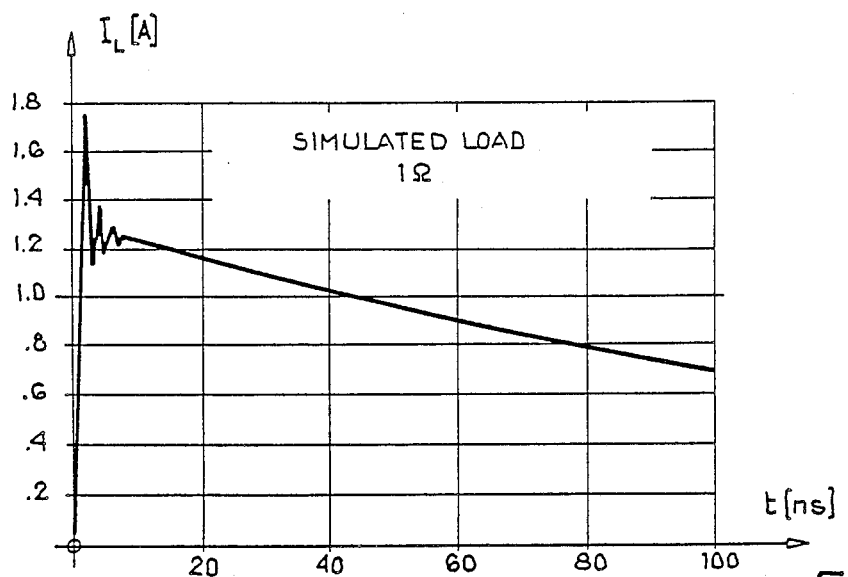
FIG. 3 is a graph illustrating the characteristic of current $I_L$ as a function of time for the simulator of FIG. 2.
Figure 4:
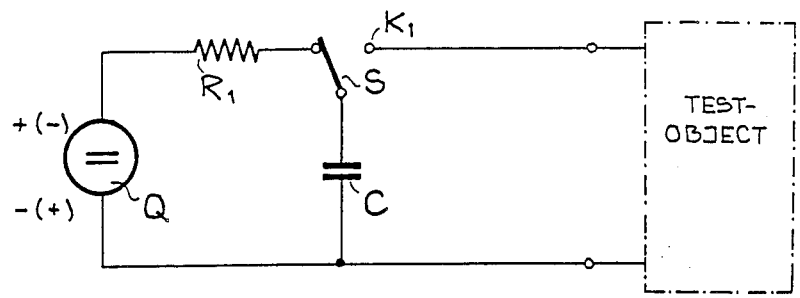
FIG. 4 is a schematic diagram of a prior art apparatus for testing integrated circuits.
Figure 5:
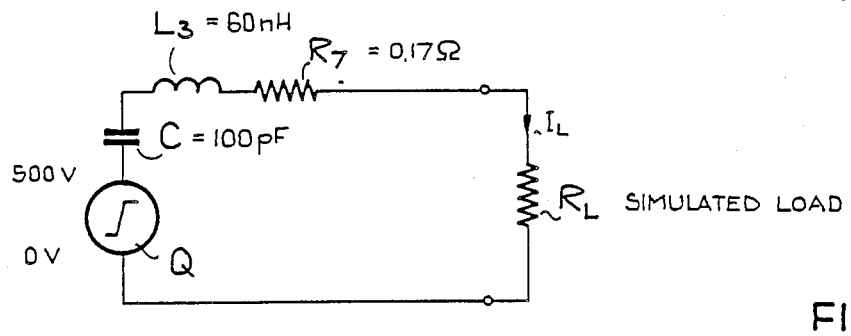
FIG. 5 is a schematic diagram of a prior art simulation circuit for simulating the response of the apparatus of FIG. 4.
Figure 6:
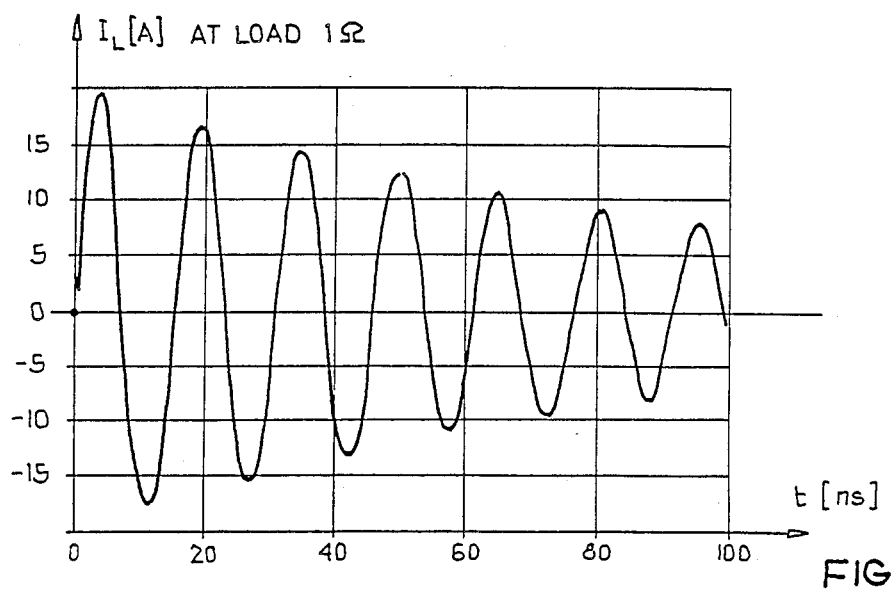
FIGS. 6 and 8 are graphs illustrating the characteristics of current $I_L$ as a function of time for the simulator of FIG. 5.
Figure 7:
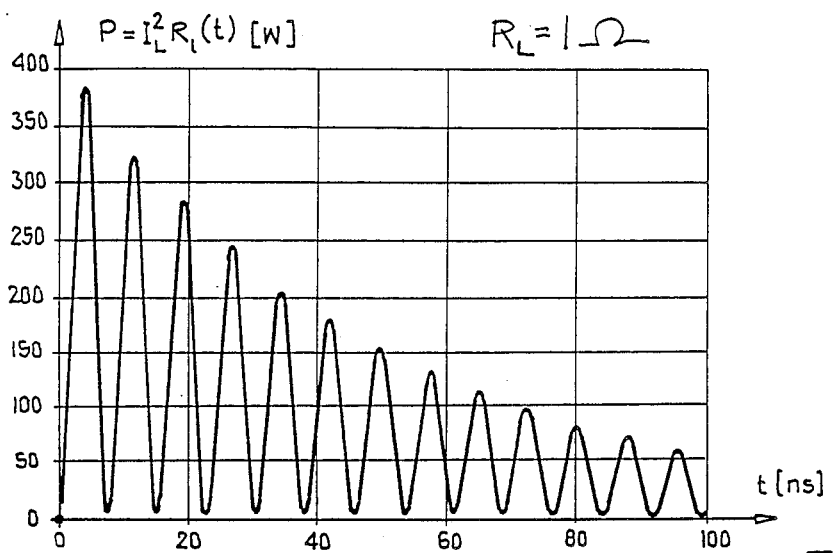
FIGS. 7 and 9 are graphs illustrating the characteristic of power P as a function of time for the simulator of FIG. 5.
Figure 8:
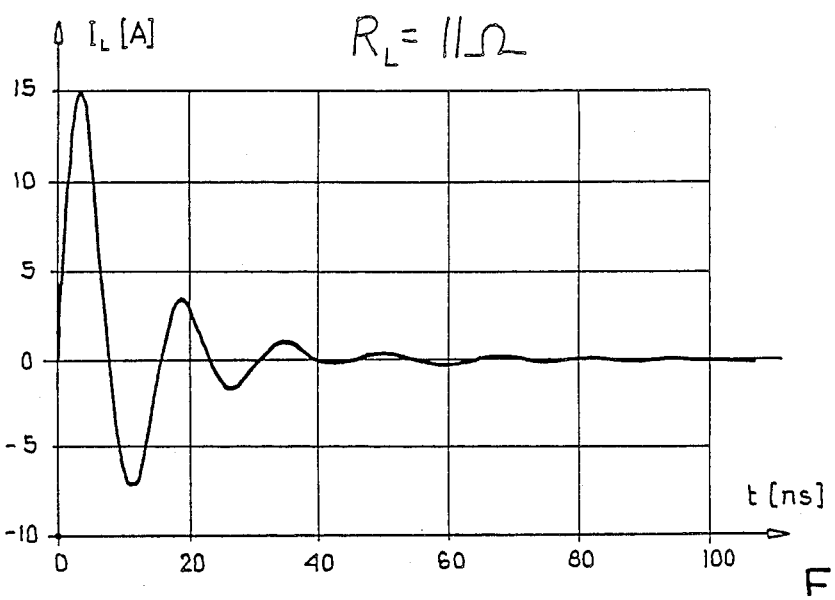
Figure 9:
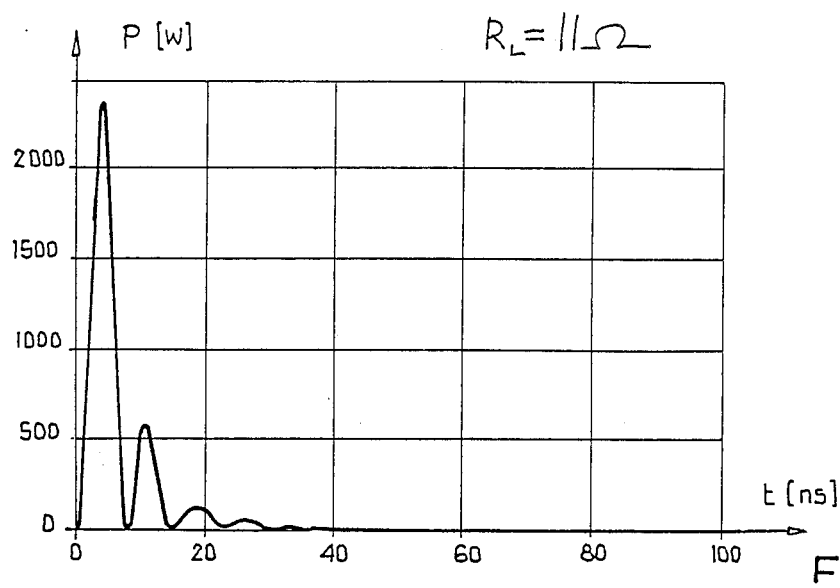
Figure 10:
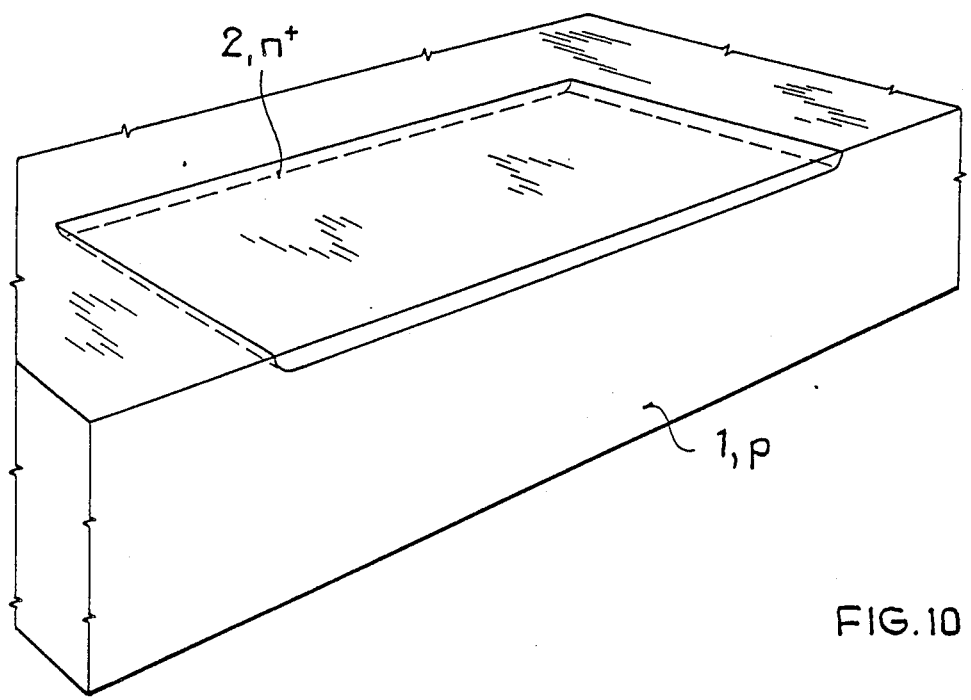
FIG. 10-14 are perspective views of the various consecutive steps of the manufacture of a protective arrangement in accordance with a first embodiment the invention.

This may be made clear in the following example. Making the following assumptions:
maximum interference current occurring = 20 A (FIG. 6),
zener voltage (13 in FIG. 16) = 7 V,
permitted peak voltage between connection pad and n-box = 150 V,
the maximum permissible resistance value, e.g. the sum of the partial regions 2', 2", and 2"' (FIG. 16), can be calculated with $$R_{max} = \frac{150 \text{ V} - 7 \text{ V}}{20 \text{ A}} = 7.15 \, \Omega$$

From this, the peak output proportion absorbed by the resistance area can be calculated as $$P_R = (150V - 7V) \times 20A = 2.86 kW.$$

The proportion of the peak output to be absorbed by the zener diode is accordingly only $$P_{ZD} = 7V \times 20A = 140W.$$

The calculation example also shows that zener diodes with a lower zener voltage than those with a higher zener voltage absorb a smaller proportion of the peak energy. If the use is planned of a resistance in the substrate area, as shown in the FIG. 16 equivalent circuit diagram, item 14, the energy occurring in the other areas for conversion into heat is reduced accordingly in the event of a fault. The smaller the proportion of energy to be converted into heat in the voltage-limiting element (zener diode), the smaller the area of this element can be. This means that if a zener diode is used as a voltage-limiting element with its surface area reduced, its junction capacity too, which depends on the layer area as well as on the doping conditions, is reduced. This is important if this junction capacity has a negative influence on the function of the integrated circuit and if this negative effect can be eliminated or reduced with a reduction of the junction area.

Figure 27:
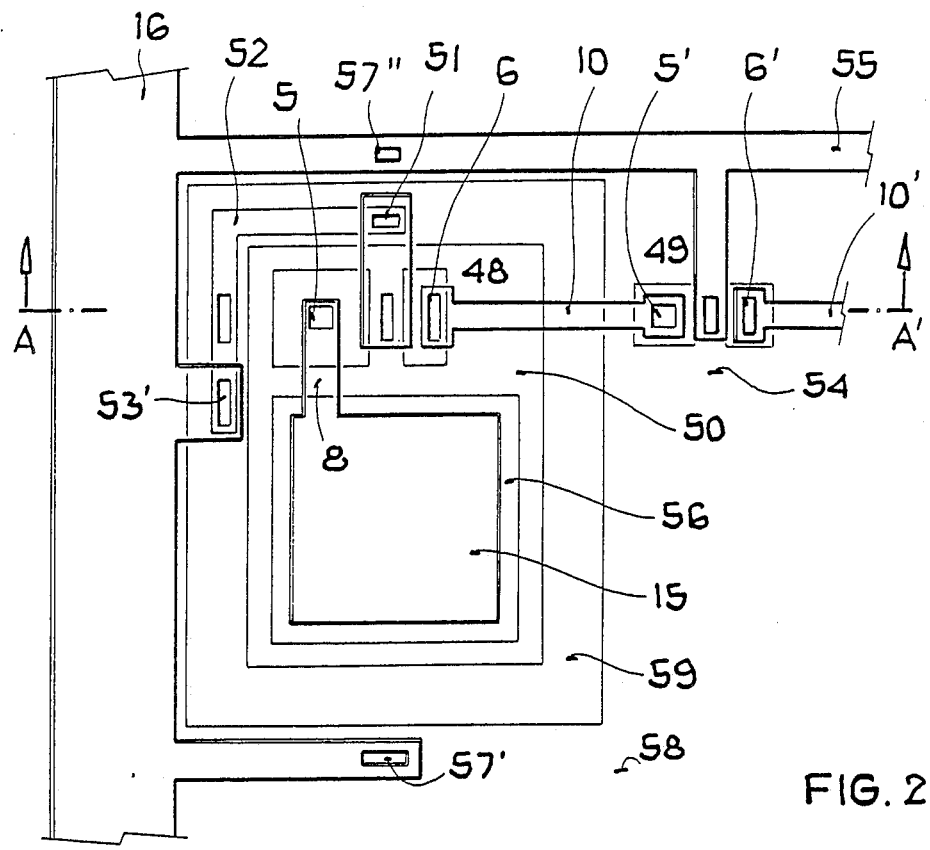
FIG. 27 is a top planar view illustrating two protective arrangements.

FIG. 27 shows an embodiment of the invention in which a second protective arrangement 49 is provided additionally to the first protective arrangement 48. The protective arrangements 48 and 49 in the arrangement according to FIG. 27 are for example embodiments as described with FIGS. 10, 11, 12, 13, 14, 15 and 16. The input 5 of the first protective arrangement 48 is connected to the connection pad 15 of the integrated circuit via the conduction path 8. The output connection 6 of the first protective arrangement 48 is connected via the conduction path 10 to the input 5' of the second protective arrangement 49, and its output 6' via the conduction path 10' to the circuit arrangement to be protected (not illustrated).

The conduction path 51 connects the substrate area 50 of the first protective arrangement 48 to the resistance zone 52 of the p-conduction type, while the contact connection zone 53' is connected to the reference point 16 (ground) of the integrated circuit. The substrate area 54 of the second circuit arrangement 49 is connected via the conduction path 55 to the reference point 16 of the integrated circuit and simultaneously to the reference point of the circuit arrangement to be protected (not illustrated). The n-zone 56 allocated to the connection pad 15 is included in the substrate area. The substrate zone 50 in which the first protective arrangement 48 is embedded is "disconnected" from the substrate zone 58 in which the second protective arrangement 49 is embedded by an n-zone 59.

Figure 28:
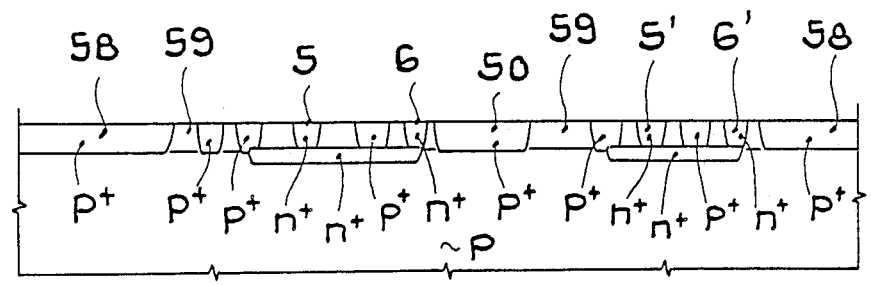
FIG. 28 is a cross-sectional view of the arrangement according to FIG. 27.
Figure 30:
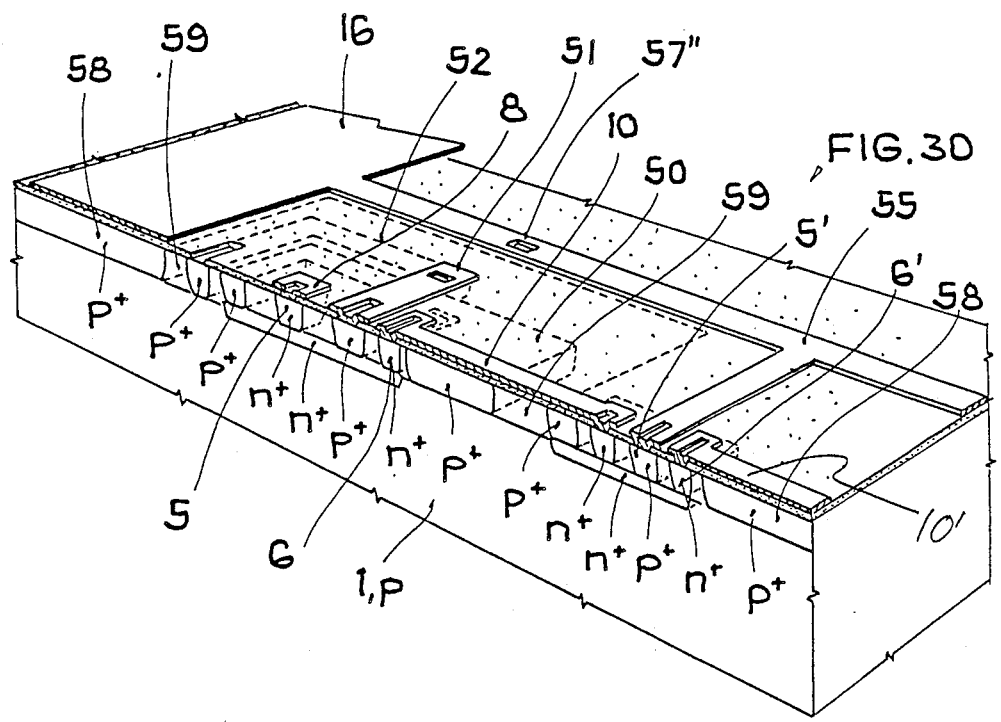
FIG. 30 is a perspective view of the arrangement according to FIG. 27.

FIG. 28 is a sectional view of the individual semiconductor zones based on a section A-A' through the arrangement according to FIG. 27, and FIG. 30 is a perspective view.

Figure 29:
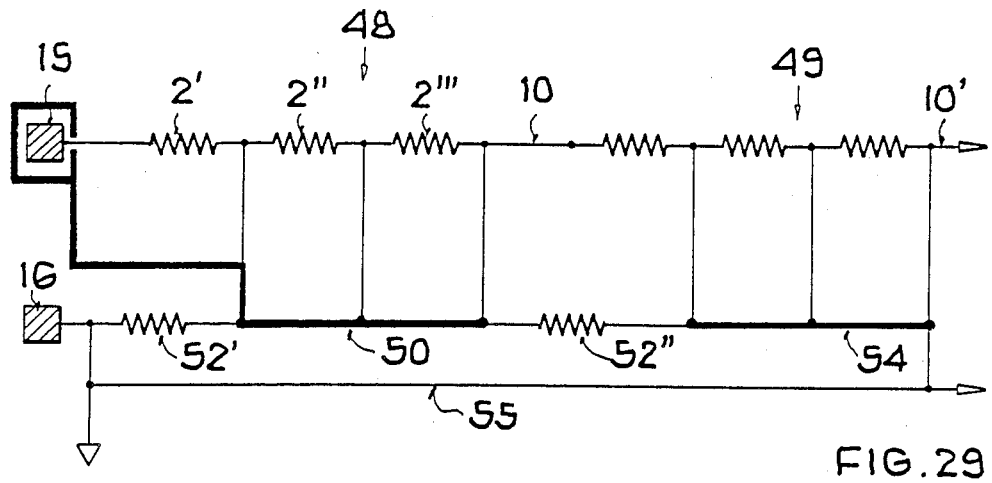
FIG. 29 is a schematic diagram of an equivalent circuit diagram of the arrangement according to FIG. 27.

FIG. 29 shows the equivalent circuit of the arrangement according to FIG. 27 with the elements of the first protective arrangement 48 and of the second protective arrangement 49. The mode of operation of the protective arrangements has already been described. The equivalent circuit according to FIG. 29 is intended to mainly show the "disconnection" of the substrate areas of the two protective arrangements 48 and 49. As FIG. 29 shows, the substrate zone 50 is connected by the resistors 52' and 52" to the reference point 16 of the integrated circuit, where the resistor 52' is generally smaller than the resistor 52" because of an arrangement of the semiconductor zones according to FIG. 27. As a result the substrate zone 54 of the second protective arrangement 49 is allocatable to the reference point 16 via the conduction path 55, whereby the effective resistance between the substrate zone 50 and the reference point 16 can be dimensioned separately. For example, the effective resistance between the substrate zone 50 and the reference point 16 can be determined by the design of the resistance zone 52 in FIG. 27.

The advantage of the arrangement according to the invention as shown in FIG. 27 is that a greater protective effect is achieved both for the circuit arrangement to be protected, which is connected behind the second protective arrangement (49), and for the other parts of the integrated circuit on account of the "disconnection" of the substrate areas. A further advantage of the arrangement according to FIG. 27 is the possibility of selecting the proportion of discharge energy (interference) absorbed by this substrate resistance with appropriate dimensioning of the substrate resistance (52', 52") such that the crystal surface requirements of the protective arrangements 48 and 49 can be selected correspondingly smaller.

In the illustrated embodiments the substrate of the integrated circuit arrangement is exemplarily illustrated as having the p-conduction type, but the invention naturally applies also to integrated circuits with a substrate of the n-conduction type and appropriately adapted conduction type for the other semiconductor zones.

The resistance provided for in the invention for protection from high-energy electrical interference is preferably connected in accordance with FIG. 16 to the connections (15, 16) of the integrated circuit arrangement on which the unwelcome electrical interference acts.

What is claimed is:

1. In an integrated circuit arrangement having respective current input and ground terminals, and including a protective circuit means, connected between said current input terminal and the remainder of the integrated circuit arrangement, for protecting the integrated circuit from excessive electrical potentials, caused by electrical faults, occurring at said current input terminal; the improvement wherein said protective circuit arrangement includes:

an integrated resistance means, connected in series between said current input terminal and a signal input for the remainder of said integrated circuit, for providing a predetermined ohmic resistance sufficient to absorb a major portion of the energy from an electrical fault appearing at said current input terminal and for distributing the heat generated by the energy absorption over a surface of said protective circuit without thermal overloading; and at least one voltage-limiting means, connected between said signal input and ground, for connecting said signal input to ground when the voltage between said signal input and ground exceeds a predetermined value.

2. An integrated circuit arrangement as defined in claim 1 wherein:

a common substrate for said integrated circuit arrangement of a first conductivity type is connected to said ground terminal; and said resistance means includes a first semiconductor zone of the opposite conductivity type formed in a first surface of said substrate, and first and second contact means for ohmically contacting said first semiconductor zone at spaced locations, with said first contact means being connected to said current input terminal and said second contact means being connected to said signal input for the remainder of said integrated circuit arrangement.

3. A protection circuit according to claim 2, further including:

a second semiconductor zone of said first conductivity type contacting said first surface of said substrate, and a third semiconductor zone of said opposite conductivity type contacting said second contact means and said second semiconductor zone and bridging therebetween, with said second and third semiconductor zones forming the p-n junction of said voltage limiting means.

4. A protection circuit according to claim 3, wherein said third semiconductor zone is spaced from said first surface.

5. A protection circuit according to claim 4, further including:

a third contact means formed on a semiconductor zone of said first conductivity type forming a separation zone around said first semiconductor zone.

6. A protection circuit according to claim 5, wherein:

the contact area between said second and third semiconductor zones forms the p-n junction of a zener diode;

said second contact means and said second semiconductor zone are formed in and extend through an epitaxial layer of the opposite conductivity type deposited on said substrate;

said third semiconductor zone is formed in but does not extend through said epitaxial layer; and said third semiconductor zone connects said second semiconductor zone to said first semiconductor zone.

7. A protection circuit according to claim 3, further including a third contact means formed on said first semiconductor zone for parallel connection to said current input terminal with said second contact means;

a fourth semiconductor zone of said first conductivity type connected to said first surface of said substrate, and a fifth semiconductor zone of said first conductivity type connecting said third contact means and said fourth semiconductor zone wherein said fourth and fifth semiconductor zones form a second voltage limiting means connecting said current input terminal and said ground terminal.

8. A protection circuit arrangement according to claim 2, further comprising an epitaxial layer located on said substrate, wherein the protective circuit is surrounded by a separation zone, and the inherent resistance of said substrate forms a part of said protection circuit.

9. A protection circuit according to claim 2, further including an epitaxial layer of said opposite conductivity type, and less strongly doped than said first semiconductor zone, formed on said first surface.

10. A protection circuit according to claim 9, further includes:

a third semiconductor zone of said opposite conductivity type formed in said first surface of said substrate, a third contact means formed on said third semiconductor zone, a fourth semiconductor zone of said first conductivity type formed partially on said third semiconductor zone and partially on said substrate, wherein said second zone is connected to said third contact means.

11. A protection circuit according to claim 9, further comprising a current-limiting element connected between said second contact means and said signal input.

12. A protection circuit arrangement according to claim 11, wherein said current-limiting element includes a field-effect transistor.

13. A protection circuit according to claim 12, wherein the drain zone of said field-effect transistor is a semiconductor zone formed in said substrate and said first semiconductor zone functions as the source zone of said transistor.

14. A protection circuit according to claim 13, wherein the gate zone of said field-effect transistor is formed in said epitaxial layer formed on said substrate.

15. A protection circuit according to claim 9, with each of said contact means including:

a respective connection zone formed in and extending through said epitaxial layer to said first semiconductor zone.

16. A protection circuit according to claim 15, wherein said first contact means contacts at the center of said first semiconductor zone, and said second contact means contacts about the periphery of said first semiconductor zone.

17. A protection circuit according to claim 16, wherein said voltage limiting means includes a zener diode, said circuit further including a second semiconductor zone of said first conductivity type extending through said epitaxial layer and contacting said first semiconductor zone forming the p-n junction of said zener diode.

18. A protection circuit according to claim 15, wherein a region of said second semiconductor zone forms an annular ring defining a first portion of said first semiconductor zone bordered by said ring, a portion of said annular ring contacting said substrate.

19. A protection circuit according to claim 18, further comprising:

a third semiconductor zone of said opposite conductivity type formed in said first surface of said substrate, a third contact means formed on said third semiconductor zone, a fourth semiconductor zone of said opposite conductivity type formed in said first surface of said substrate, a fourth contact means formed on said fourth semiconductor zone, a fifth semiconductor zone of said first conductivity type having a first region surrounding said third semiconductor zone formed partially on said third semiconductor zone and partially on said substrate, and a second region surrounding said fourth semiconductor zone formed partially on said fourth semiconductor zone and partially on said substrate, and a sixth semiconductor zone of said first conductivity type formed partially on said first semiconductor zone and partially on said substrate, said first and sixth semiconductor zones forming a second voltage limiting means, wherein said second zone is connected to said third contact means, said sixth zone is connected to said fourth contact means.

20. A protection circuit arrangement according to claim 19, wherein said first semiconductor zone is bordered by a third region of said fifth semiconductor zone, and said second contact means is formed on said first semiconductor zone outside that portion of said first semiconductor zone bordered by said third region of said fifth semiconductor zone.

21. A protection circuit according to claim 18, wherein said first contact means is of said opposite conductivity type and contacts said first portion of said first semiconductor zone, and said second contact means is of said opposite conductivity type and is formed on a region of said first semiconductor zone outside of said annular ring.

22. A protection circuit according to claim 2, wherein said first semiconductor zone has an essentially rectangular cross-section.

23. A protection circuit according to claim 2, wherein said first semiconductor zone has an essentially circular cross-section.

24. A protection circuit according to claim 1, said voltage limiting means comprising a plurality of zener diodes connected between said signal input and said ground terminal, wherein each of said diodes is formed by a semiconductor region of a first conductivity type and a semiconductor region of the opposite conductivity type.

25. A protection circuit arrangement according to claim 24, wherein two of said zener diodes are connected with one another in series.

26. A protection circuit arrangement according to claim 25, wherein the series connection of the two zener diodes is achieved by a conduction path connecting a semiconductor zone of said first conductivity type of a first zener diode with a semiconductor zone of said opposite conductivity type of a second zener diode.

27. An integrated circuit having a plurality of protective circuits according to claim 1 connected in series between said current input terminal and said signal input for said integrated circuit.

* * * * *